United States Patent
Chiu et al.

(10) Patent No.: US 12,283,505 B2
(45) Date of Patent: Apr. 22, 2025

(54) SUBSTRATE RETAINING ASSEMBLY AND DOOR DEVICE

(71) Applicants: GUDENG PRECISION INDUSTRIAL CO., LTD., New Taipei (TW); TAIWAN SEMICONDUCTOR MANUFACTURING COMPANY, LTD., Hsinchu (TW)

(72) Inventors: Ming-Chien Chiu, New Taipei (TW); Chia-Ho Chuang, New Taipei (TW); Kuo-Hua Lee, New Taipei (TW); Jyun-Ming Lyu, New Taipei (TW); Tzu Ang Chiang, I-lan (TW); Yi-Feng Huang, Kaohsiung (TW); Tsung-Yi Lin, Tainan (TW)

(73) Assignees: GUDENG PRECISION INDUSTRIAL CO., LTD., New Taipei (TW); TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 50 days.

(21) Appl. No.: 18/322,263

(22) Filed: May 23, 2023

(65) Prior Publication Data
US 2023/0395412 A1 Dec. 7, 2023

Related U.S. Application Data

(60) Provisional application No. 63/348,004, filed on Jun. 1, 2022.

(30) Foreign Application Priority Data

Apr. 26, 2023 (TW) .................................. 112115638

(51) Int. Cl.
H01L 21/673 (2006.01)

(52) U.S. Cl.
CPC .. *H01L 21/67373* (2013.01); *H01L 21/67386* (2013.01)

(58) Field of Classification Search
CPC ...... B65D 81/053; B65D 85/30; B65D 81/05; H01L 21/673; H01L 21/67369; H01L 21/67373; H01L 21/67386
(Continued)

(56) References Cited

U.S. PATENT DOCUMENTS 6,591,987 B2 * 7/2003 Wu ................... H01L 21/67369
206/711
6,951,284 B2 * 10/2005 Cheesman ........ H01L 21/67369
206/711
(Continued)

FOREIGN PATENT DOCUMENTS

CN 101667552 A 3/2010
CN 101685788 A 3/2010
(Continued)

*Primary Examiner* — Bryon P Gehman
(74) *Attorney, Agent, or Firm* — Birch, Stewart, Kolasch & Birch, LLP (57) ABSTRACT

A door device includes a door body and a substrate retaining assembly. The substrate retaining assembly is disposed on a side of the door body. The substrate retaining assembly includes a retaining body and a plurality of retaining members. The retaining members are disposed on the retaining body and arranged at intervals. Each of the retaining members includes two elastic arms and a clamping structure. The clamping structure includes a clamping body, a clamping groove, and at least one relief portion. The clamping body is connected between the two elastic arms. The clamping groove is located on the clamping body and is communicated with adjacent ends of the elastic arms. The relief portion and the clamping groove are communicated to each other.

18 Claims, 11 Drawing Sheets

(58) Field of Classification Search
USPC .................................................. 206/710, 711
See application file for complete search history.

(56) References Cited

U.S. PATENT DOCUMENTS

| | | | |
|---|---|---|---|
| 7,971,722 B2 * | 7/2011 | Lin | ................... H01L 21/67369 |
| | | | 206/711 |
| 8,356,713 B2 * | 1/2013 | Ogawa | .............. H01L 21/67369 |
| | | | 206/711 |
| 2005/0161367 A1 | 7/2005 | Matsutori et al. | |
| 2007/0295638 A1 * | 12/2007 | Nakatogawa | ..... H01L 21/67386 |
| | | | 206/711 |
| 2010/0038281 A1 * | 2/2010 | Lin | ................... H01L 21/67373 |
| | | | 206/710 |
| 2010/0258475 A1 | 10/2010 | Ogawa | |
| 2013/0319907 A1 | 12/2013 | Gregerson et al. | |

FOREIGN PATENT DOCUMENTS

| | | |
|---|---|---|
| CN | 101685789 A | 3/2010 |
| JP | 2005-101518 A | 4/2005 |
| JP | 2009-124063 A | 6/2009 |
| KR | 10-2006-0044862 A | 5/2006 |
| TW | 201009986 A | 3/2010 |
| WO | 2009/060782 A1 | 5/2009 |

* cited by examiner

SUBSTRATE RETAINING ASSEMBLY AND DOOR DEVICE

CROSS-REFERENCE TO RELATED APPLICATION

This application claims priority to U.S. Provisional Application Ser. No. 63/348,004 filed Jun. 1, 2022, and Taiwan Application Serial Number 112115638, filed Apr. 26, 2023, the disclosures of which are incorporated herein by reference in their entireties.

BACKGROUND

Technical Field

The present disclosure relates to a substrate retaining assembly and a door device.

Description of Related Art

Containers for accommodating and carrying substrates may be referred to as substrate containers. The substrates can be semiconductor devices such as printed circuit boards (PCBs) or wafers. For example, a substrate container used to accommodate and carry wafers is generally called a wafer cassette. A common wafer cassette includes a box body and a door body. The door body is used to be installed on the box body. Supporting members that can accommodate a plurality of wafers are provided in the box body. The supporting members make the wafers to be horizontal and arranged at intervals.

Generally speaking, during the transportation process of a wafer cassette, the wafers will be out of positions due to vibration or move towards the door body, thereby causing damages to the wafers. In order to solve this problem, a wafer retainer which can support the wafers to provide a more stable support effect is usually installed on the door body, so as to solve the problem of unstable movements and damages of the wafers caused by vibration during transportation. However, for the contacts between the wafer retainer and the wafers, many factors such as friction, support, and shock absorption need to be considered.

Accordingly, how to provide a substrate retaining assembly and a door device to solve the aforementioned problems becomes an important issue to be solved by those in the industry.

SUMMARY

An aspect of the disclosure is to provide a substrate retaining assembly and a door device that can efficiently solve the aforementioned problems.

According to an embodiment of the disclosure, a substrate retaining assembly includes a retaining body and a plurality of retaining members. The retaining members are disposed on the retaining body and arranged at intervals. Each of the retaining members includes two elastic arms and a clamping structure. The clamping structure includes a clamping body, a clamping groove, and at least one relief portion. The clamping body is connected between the two elastic arms. The clamping groove is located on the clamping body and communicated with adjacent ends of the elastic arms. The relief portion is communicated to the clamping groove.

In an embodiment of the disclosure, the clamping groove has two clamping surfaces opposite to each other. The relief portion is recessed relative to at least one of the two clamping surfaces.

In an embodiment of the disclosure, the clamping structure further includes two wall portions. The two wall portions are disposed on the clamping body. The clamping groove and the relief portion are formed between the two wall portions.

In an embodiment of the disclosure, the clamping body and the relief portion are laterally communicated. A longitudinal section width of the clamping groove is smaller than a longitudinal section width of the relief portion.

In an embodiment of the disclosure, the relief portion is a recessed groove, a through hole running through the clamping body, or a combination thereof.

In an embodiment of the disclosure, a number of the at least one relief portion is plural. The relief portions include at least one first relief portion and at least one second relief portion. The second relief portion is spaced apart from the first relief portion. The first relief portion and the second relief portion are structures with different depths.

In an embodiment of the disclosure, each of the elastic arms has a first end and a second end. The first end is connected to the retaining body. The second end is connected to the clamping structure. A thickness of the first end is greater than a thickness of the second end.

In an embodiment of the disclosure, the first end of each of the elastic arms extends to the second end in a gradual manner from thick to thin.

In an embodiment of the disclosure, the second end of each of the elastic arms is connected to the clamping body of the clamping structure. The thickness of the second end is smaller than a thickness of the clamping body.

According to an embodiment of the disclosure, a door device includes a door body and the substrate retaining assembly. The substrate retaining assembly is disposed on a side of the door body.

Accordingly, in the substrate retaining assembly and the door device of the present disclosure, since the clamping structure of the retaining member is provided with the clamping groove and the relief portion, it can effectively reduce the direct contact area of the clamping structure when it abuts against a substrate such as a wafer. Moreover, in conjunction with the varying thickness design of the elastic arms of the retaining member, the effect of sufficient elastic margin and structural strength can be achieved. In this way, the overall substrate retaining assembly can effectively avoid problems such as cracks and breakage of the wafer due to excessive preload.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Figure 1:
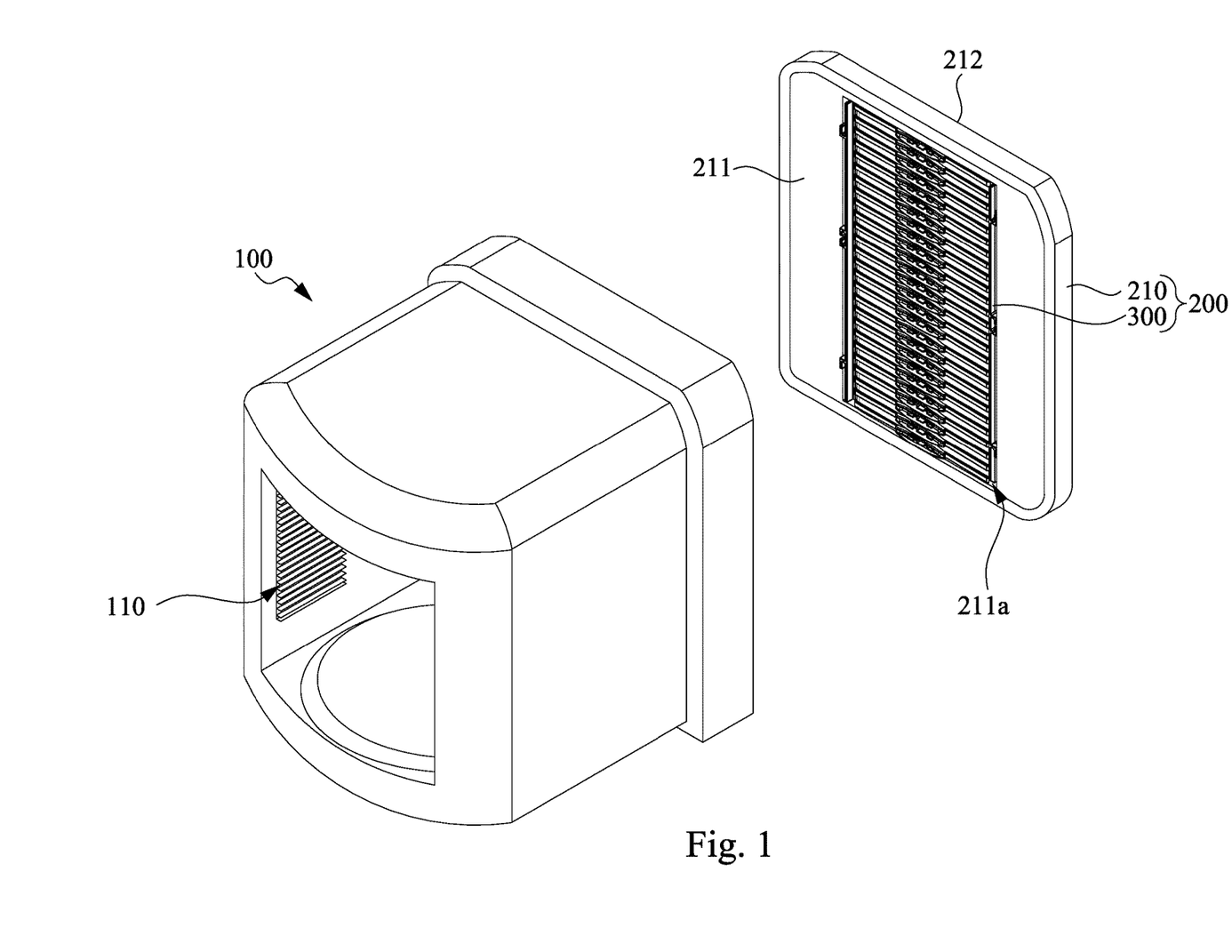
FIG. 1 is a partial exploded view of a substrate container according to an embodiment of the disclosure.

Reference is made to FIG. 1. FIG. 1 is a partial exploded view of a substrate container according to an embodiment of the disclosure. As shown in FIG. 1, the substrate container is a front opening unified pod (FOUP) as an example for illustration. The substrate container includes a box body 100 and a door device 200. The door device 200 is used to seal and close or open the box body 100. The box body 100 is used to carry a plurality of wafers therein, and supports 110 are disposed in the box body 100 to support the plurality of wafers at intervals, which will be described in detail later. The door device 200 includes a door body 210 and a substrate retaining assembly 300. The door body 210 has an inner surface 211 and an outer surface 212. A recessed area 211a is configured approximately in the middle of the inner surface 211 of the door body 210. The recessed area 211a can be used to configure the substrate retaining assembly 300, and the substrate retaining assembly 300 is used to abut against edge portions of the plurality of wafers inside the box body 100.

In practical applications, the substrate container may be a standard mechanical interface (SMIF) or a front opening shipping box (FOSB). As long as the door device 200 applicable to the present disclosure should be included in the scope of the present disclosure. The present disclosure does not limit the type of the substrate container.

During the process of the door body 210 being closed to the box body 100, the substrate retaining assembly 300 can abut against and retain each wafer in the box body 100. In addition to providing a more stable support effect, it can also avoid unstable movement of the wafers due to vibration during transportation, in which the unstable movement may cause particle phenomenon and damages.

In addition, in some embodiments, the door device 200 may be provided with at least one latch structure (not shown). The latch structure is adjacent to the outer surface 212 of the door body 210 for opening or closing the substrate container.

Figure 2:
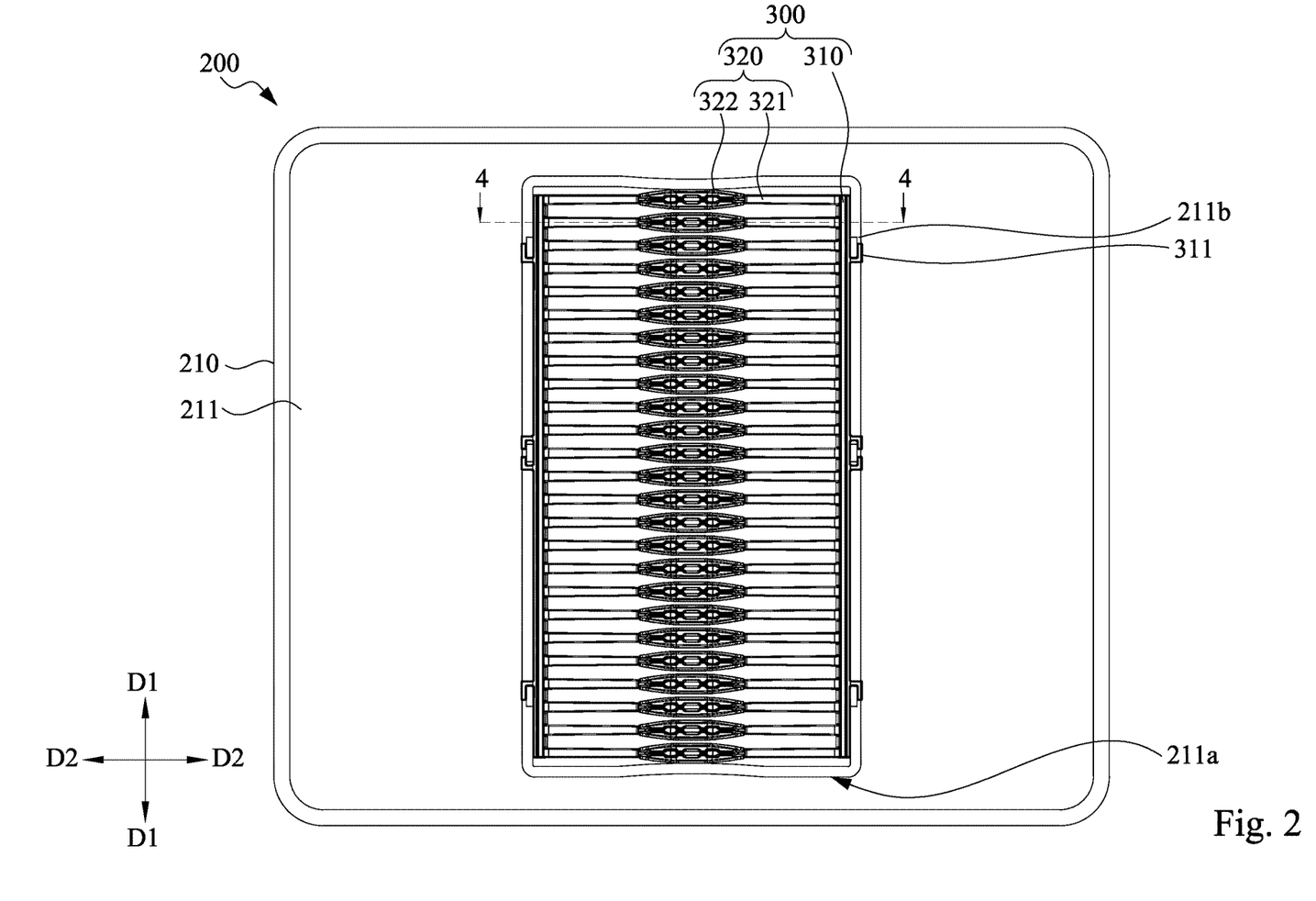
FIG. 2 is a front view of a door device in FIG. 1, in which the door device is equipped with a substrate retaining assembly.
Figure 3:
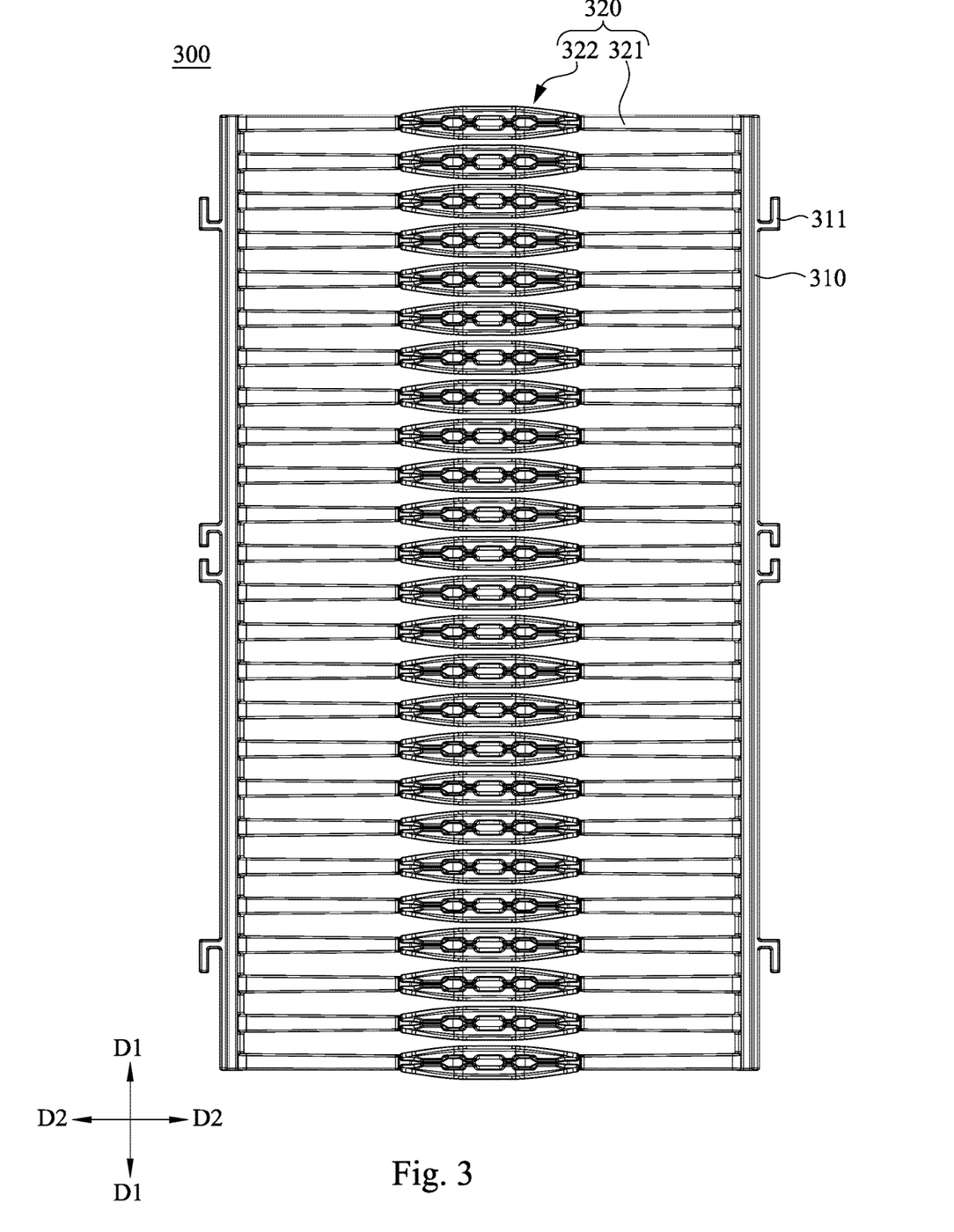
FIG. 3 is a front view of the substrate retaining assembly in FIG. 2.

Reference is made to FIGS. 2 and 3. FIG. 2 is a front view of the door device 200 in FIG. 1, in which the door device 200 is equipped with the substrate retaining assembly 300. FIG. 3 is a front view of the substrate retaining assembly 300 in FIG. 2. As shown in FIG. 2, in the present embodiment, the substrate retaining assembly 300 includes a retaining body 310 and a plurality of retaining members 320. Specifically, the retaining body 310 is configured to be installed on the inner surface 211 of the door body 210, and the plurality of retaining members 320 are disposed on the retaining body 310 and sequentially arranged at intervals along a direction D1. The retaining body 310 and the plurality of retaining members 320 are configured with a width sufficient to abut against the wafers in a direction D2 of the door body 210.

In some embodiments, the direction D1 and the direction D2 are perpendicular to each other, but the present disclosure is not limited thereto.

The substrate retaining assembly 300 may be fixed on the door body 210 by docking assembly or embedding. Take the docking assembly method as an example, as shown in FIG. 2. The door body 210 further includes a plurality of first docking portions 211b (such as engaging blocks). The first docking portions 211b are disposed on the inner surface 211 of the door body 210 and located in the recessed area 211a. The substrate retaining assembly 300 further includes a plurality of second docking portions 311 (such as hooks). The second docking portions 311 are disposed on one side of the retaining body 310, and the second docking portions 311 are disposed on opposite sides of the plurality of retaining members 320. The first docking portions 211b and the second docking portions 311 are mated and fixed (for example, the engaging blocks and the hooks are engaged and fixed with each other), so that the substrate retaining assembly 300 can be fixed on the door body 210. The present disclosure does not limit the structural designs of the first docking portions 211b and the second docking portions 311, as long as the structures that can match and fix each other belong to the scope of protection of the present disclosure.

Figure 4:
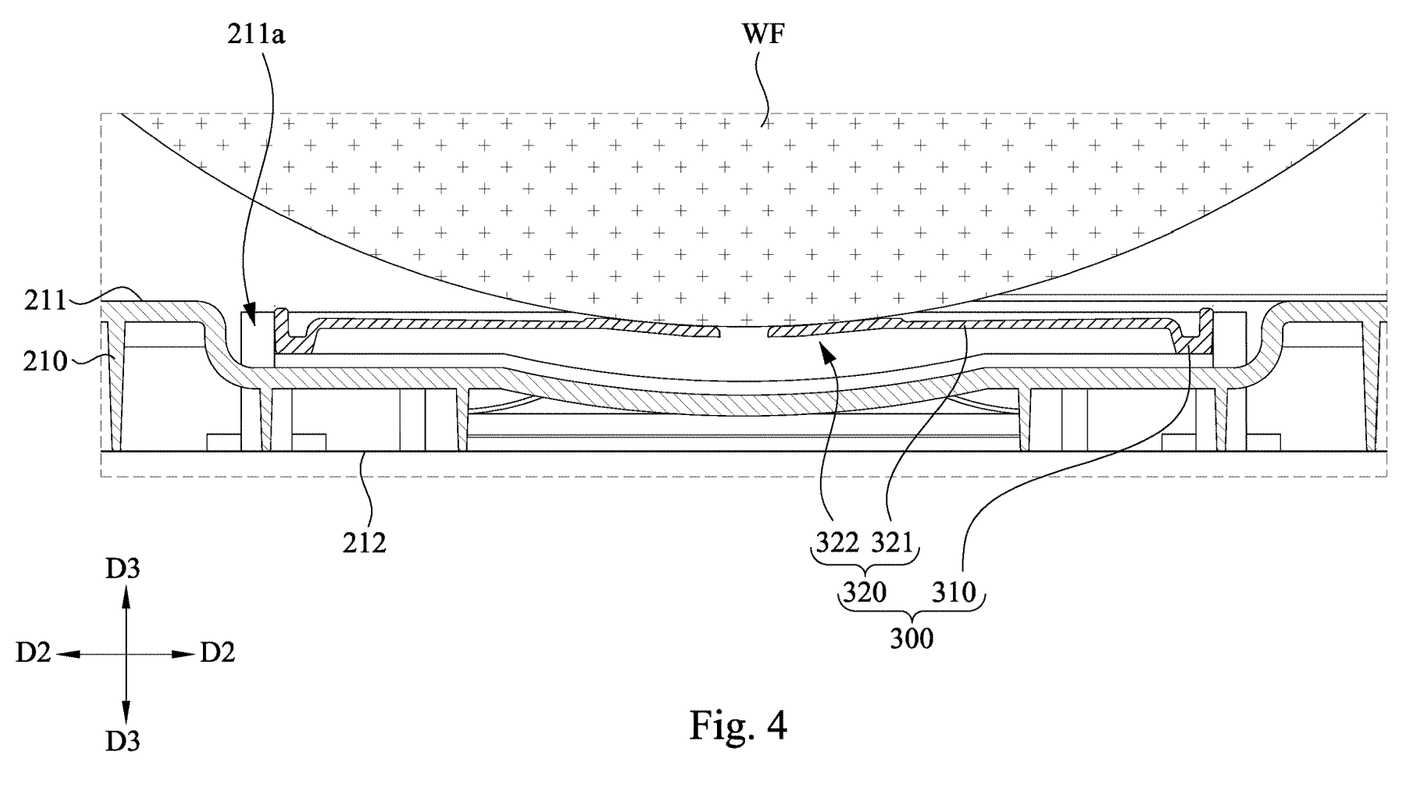
FIG. 4 is a partial cross-sectional view of the substrate retaining assembly abutting against a wafer after the structure in FIG. 2 is cut along line 4-4.
Figure 5:
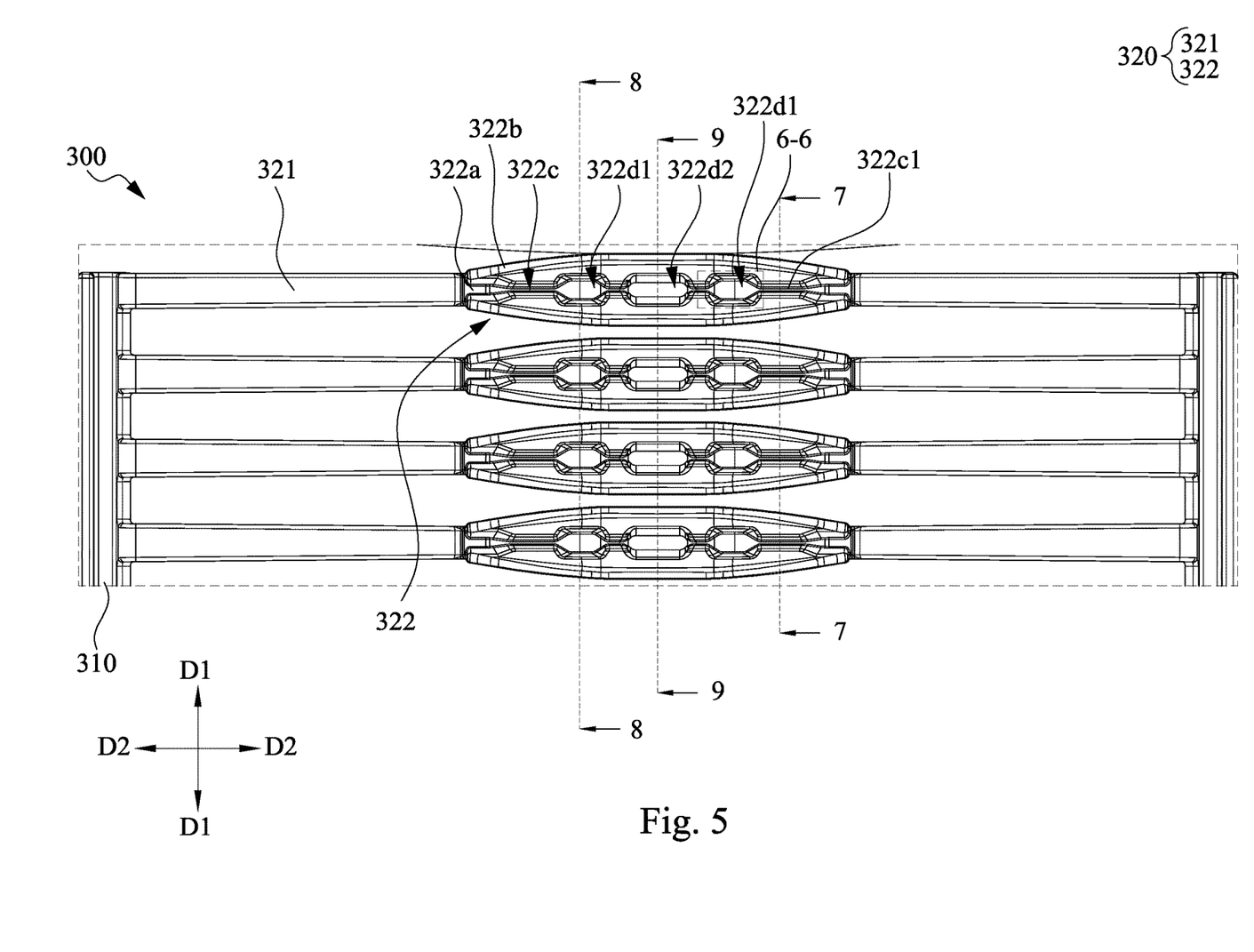
FIG. 5 is a partial enlarged view of the substrate retaining assembly in FIG. 2.

Reference is made to FIGS. 4 and 5. FIG. 4 is a partial cross-sectional view of the substrate retaining assembly 300 abutting against a wafer after the structure in FIG. 2 is cut along line 4-4. FIG. 5 is a partial enlarged view of the substrate retaining assembly 300 in FIG. 2. As shown in FIGS. 2 to 5, in the present embodiment, the retaining member 320 includes two elastic arms 321 and a clamping structure 322. The elastic arms 321 provide an elastic buffering margin according to the abutting force of the clamping structure 322 by the wafer WF. On the contrary, when the clamping structure 322 is not in contact with the wafer WF, the elastic arms 321 are in an elastic reset state. By virtue of the elastic properties of the elastic arms 321, the amount of interference at the contact position between the substrate retaining assembly 300 and the wafer WF can be absorbed.

The clamping structure 322 includes a clamping body 322a, a clamping groove 322c, and at least one relief portion. In the present embodiment, the clamping structure 322 includes a plurality of relief portions 322d1, 322d2. For example, the clamping structure 322 includes two relief portions 322d1 and one relief portion 322d2. The relief portions 322d2 is spaced between the two relief portions 322d1. The clamping body 322a is connected between the two elastic arms 321, and is connected to the retaining body 310 via the two elastic arms 321. The clamping groove 322c is located on the clamping body 322a and communicated with adjacent ends of the two elastic arms 321. The clamping groove 322c is located on one side of the clamping body 322a (that is, facing toward the inside of the box body 100), and is configured to clamp the wafer WF. The relief portions 322d1, 322d2 are arranged at intervals along the direction D2. The relief portions 322d1, 322d2 are laterally communicated to the clamping groove 322c along the direction D2 of the clamping body 322a.

Figure 6:
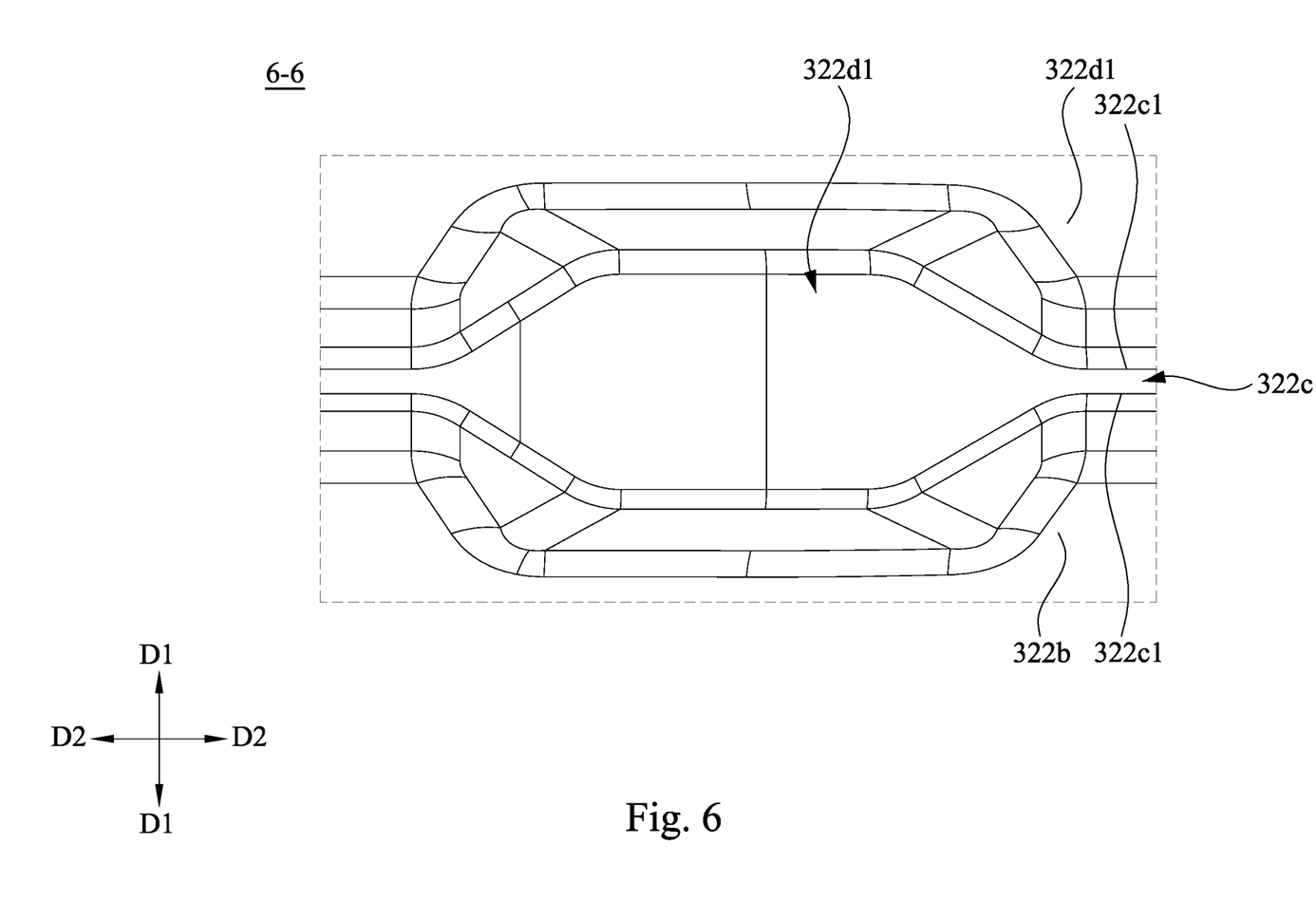
FIG. 6 is a partially enlarged view of area 6-6 in FIG. 5.

Reference is made to FIGS. 5 and 6. FIG. 6 is a partially enlarged view of area 6-6 in FIG. 5. In the present embodiment, the clamping groove 322c of the clamping structure 322 has two clamping surfaces 322c1 opposite to each other. The two clamping surfaces 322c1 are respectively configured to clamp opposite surfaces of the edge of the wafer WF. The relief portions 322d1, 322d2 are recessed relative to the two clamping surfaces 322c1. The relief portions 322d1 are recessed upward relative to the upper clamping surface 322c1 along the direction D1, and are recessed downward relative to the lower clamping surface 322c1 along the direction D1. In this way, the relief portions 322d1, 322d2 form relief spaces with larger widths than the clamping groove 322c and are not in direct contact with the wafer WF.

In practical applications, the relief portions 322d1, 322d2 may only be recessed upwards relative to the upper clamping surface 322c1 along the direction D1, or may only be recessed downwards relative to the lower clamping surface 322c1 along the direction D1. In this way, the effect of avoiding damage to the wafer WF due to excessive preload can also be achieved.

Figure 7:
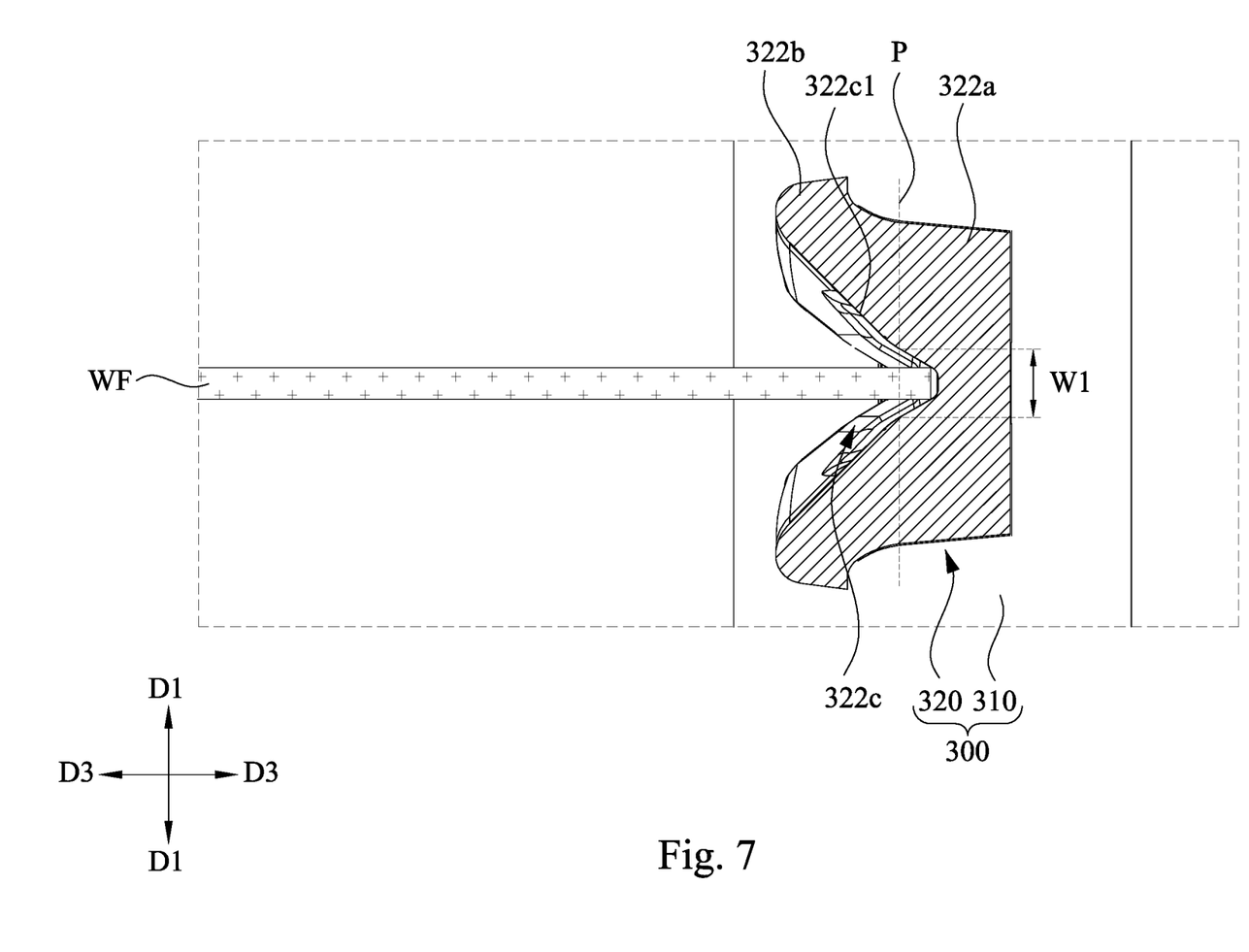
FIG. 7 is a partial cross-sectional view of the substrate retaining assembly abutting against the wafer after the structure in FIG. 5 is cut along line 7-7.

Reference is made to FIG. 7. FIG. 7 is a partial cross-sectional view of the substrate retaining assembly abutting against the wafer after the structure in FIG. 5 is cut along line 7-7. In the present embodiment, a contour of the clamping groove 322c is substantially V-shaped, so that the wafer WF can be smoothly introduced into the clamping groove 322c when it contacts the clamping surfaces 322c1 of the clamping groove 322c. In this way, up and down movements of the wafer WF due to shaking or vibration during transportation can be avoided. A wear-resistant consumable material, such as polyetheretherketone (PEEK), can be coated on the clamping surfaces 322c1 in contact with the wafer WF, so as to reduce the dust problem caused by friction.

As shown in FIGS. 5 to 7, in the present embodiment, the clamping structure 322 further includes two wall portions 322b. The two wall portions 322b are disposed on a side of the clamping body 322a (that is, facing toward the inside of the box body 100). The clamping groove 322c and the relief portions 322d1, 322d2 are formed between the two wall portions 322b. It can be seen from this that the two clamping surfaces 322c1 are partial surfaces of the two wall portions 322b forming the clamping groove 322c.

Figure 8:
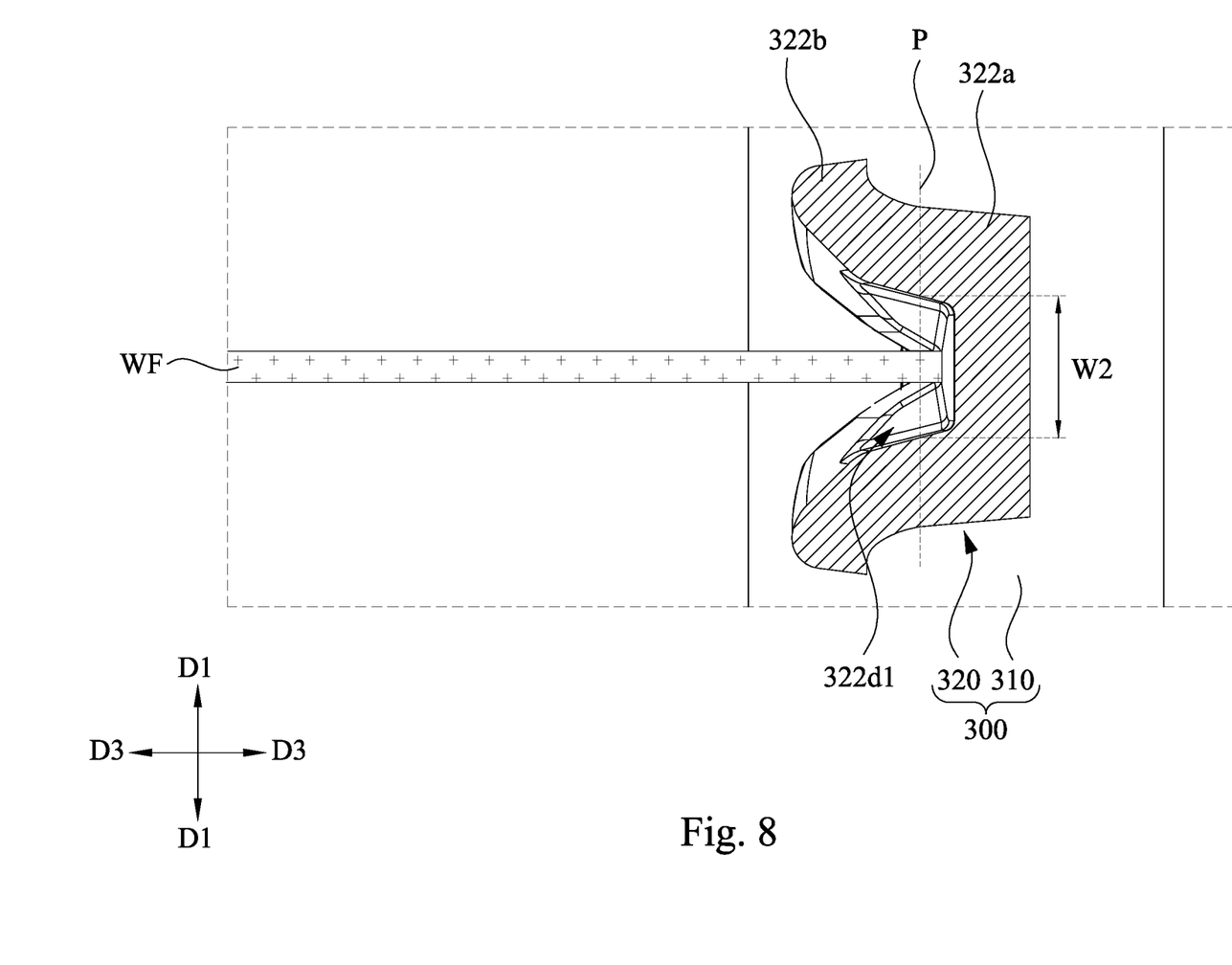
FIG. 8 is a partial cross-sectional view of the substrate retaining assembly abutting against the wafer after the structure in FIG. 5 is cut along line 8-8.
Figure 9:
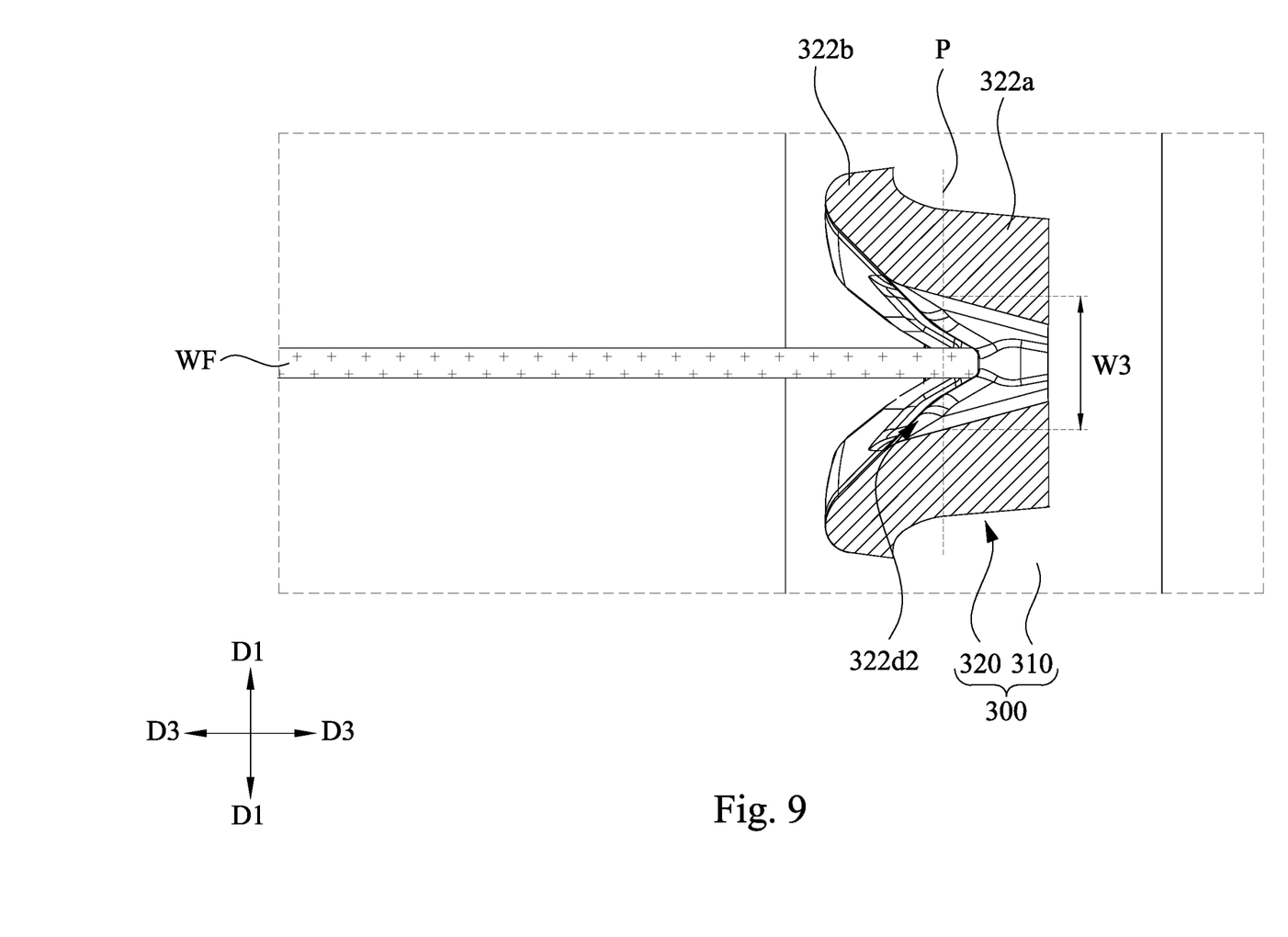
FIG. 9 is a partial cross-sectional view of the substrate retaining assembly abutting against the wafer after the structure in FIG. 5 is cut along line 9-9.

Reference is made to FIGS. 8 and 9. FIG. 8 is a partial cross-sectional view of the substrate retaining assembly abutting against the wafer after the structure in FIG. 5 is cut along line 8-8. FIG. 9 is a partial cross-sectional view of the substrate retaining assembly abutting against the wafer after the structure in FIG. 5 is cut along line 9-9. As shown in FIGS. 7 to 9, in the present embodiment, a width W2 of the relief portion 322d1 between the two wall portions 322b is greater than a width W1 of the clamping groove 322c between the two wall portions 322b. A width W3 of the relief portion 322d2 between the two wall portions 322b is greater than the width W1 of the clamping groove 322c between the two wall portions 322b. Specifically, the widths W1, W2, W3 can be measured on a longitudinal section P of the clamping groove 322c and the relief portions 322d1, 322d2 along the direction D1, and the longitudinal section P is parallel to the directions D1, D2 (see FIG. 5). For example, the width W1 is the maximum width of the clamping groove 322c on the longitudinal section P between the two wall portions 322b. The width W2 is the maximum width of the relief portion 322d1 on the longitudinal section P between the two wall portions 322b. The width W3 is the maximum width of the relief portion 322d2 on the longitudinal section P between the two wall portions 322b.

As shown in FIGS. 5 and 8, in the present embodiment, the relief portion 322d1 is designed as a recessed groove. As shown in FIG. 9, in the present embodiment, the relief portion 322d2 is designed as a through hole. The through hole runs through the clamping body 322a of the clamping structure 322 along a direction D3. The direction D3 is perpendicular to at least one of the directions D1, D2, but the disclosure is not limited thereto.

It should be noted that the relief portion 322d2 is located in the central region of the clamping structure 322 relative to the two relief portions 322d1 in the direction D2, and this central region is also the largest contact region when the clamping structure 322 contacts the wafer WF. Therefore, the relief portion 322d2 in the form of a through hole can provide a greater relief effect in the central region than the relief portions 322d1 in the form of recessed grooves, thereby solving the problem of damage to the wafer WF due to excessive preload. For example, when the clamping structure 322 contacts the wafer WF, the preloading amount of the wafer WF by the relief portion 322d2 located in the central region of the clamping structure 322 is minimal or close to zero.

In practical applications, at least one of the relief portions 322d1 in the form of recessed grooves may be modified into the relief portion 322d2 in the form of a through hole. The relief portion 322d2 in the form of a through hole may also be modified into the relief portion 322d1 in the form of a recessed groove. The number of the relief portions 322d1, 322d2 of the clamping structure 322 and the structural designs of the recessed grooves and through holes can be elastically modified or changed according to actual needs.

Figure 10:
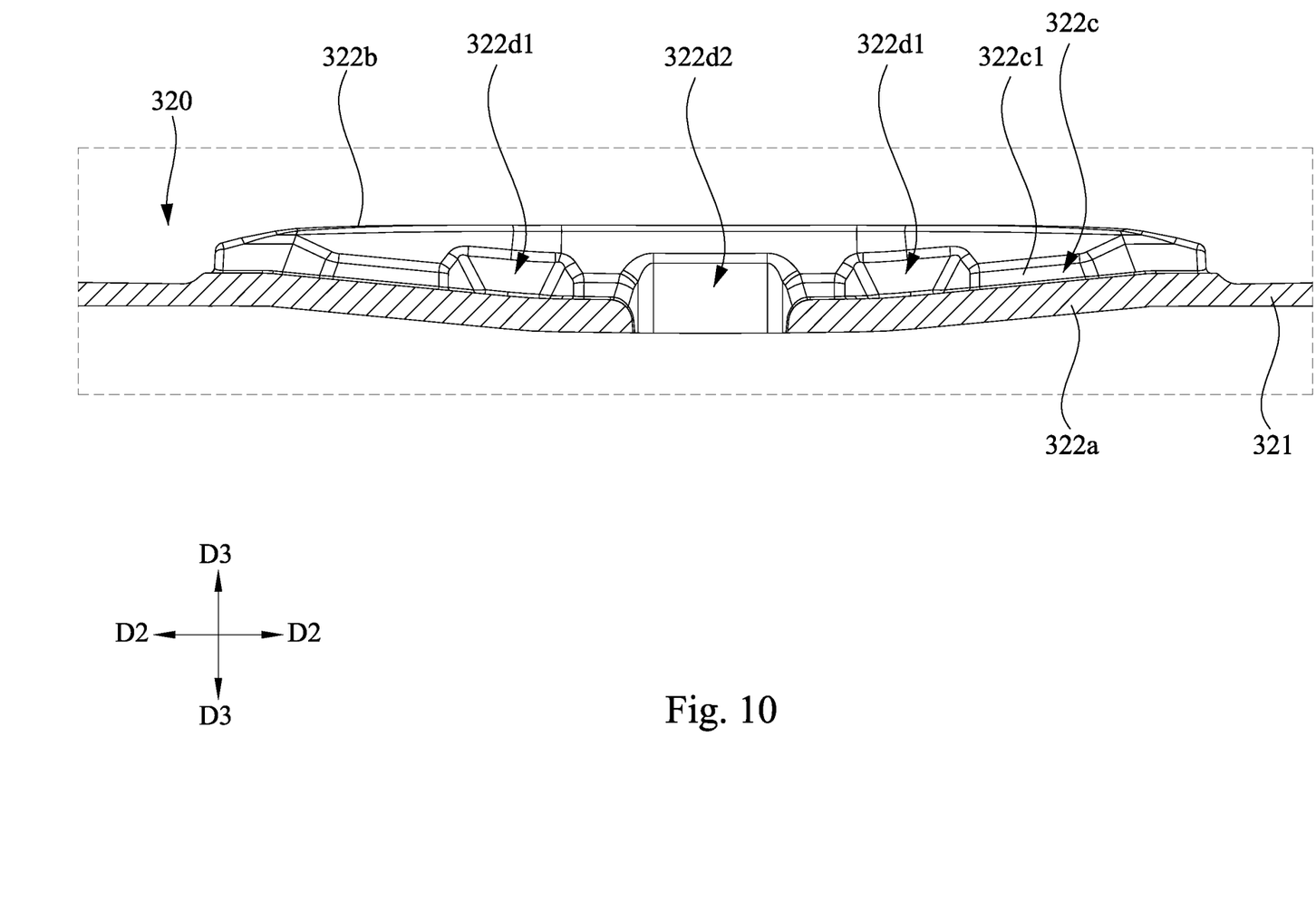
FIG. 10 is a partial cross-sectional view of the substrate retaining assembly in FIG. 2 after being cut along line 4-4.

Reference is made to FIG. 10. FIG. 10 is a partial cross-sectional view of the substrate retaining assembly 300 in FIG. 2 after being cut along line 4-4. In the present embodiment, the two relief portions 322d1 are not recessed in the direction D3 relative to the clamping body 322a, and the relief portion 322d2 runs through the clamping body 322a of the clamping structure 322 in the direction D3. In other words, a depth of the two relief portions 322d1 relative to the clamping body 322a in the direction D3 is 0, a depth of the relief portion 322d2 relative to the clamping body 322a in the direction D3 is equal to a thickness T3 of the clamping body 322a (see FIG. 11), but the present disclosure is not limited thereto. The relief portions 322d1, 322d2 are structures with different depths.

With the above structural designs, when the clamping structure 322 supports the wafer WF, the area directly contacting the wafer WF can be effectively reduced by the relief portions 322d1, 322d2. In this way, problems such as cracks and breakage of the wafer WF due to excessive preload can be effectively avoided.

Figure 11:
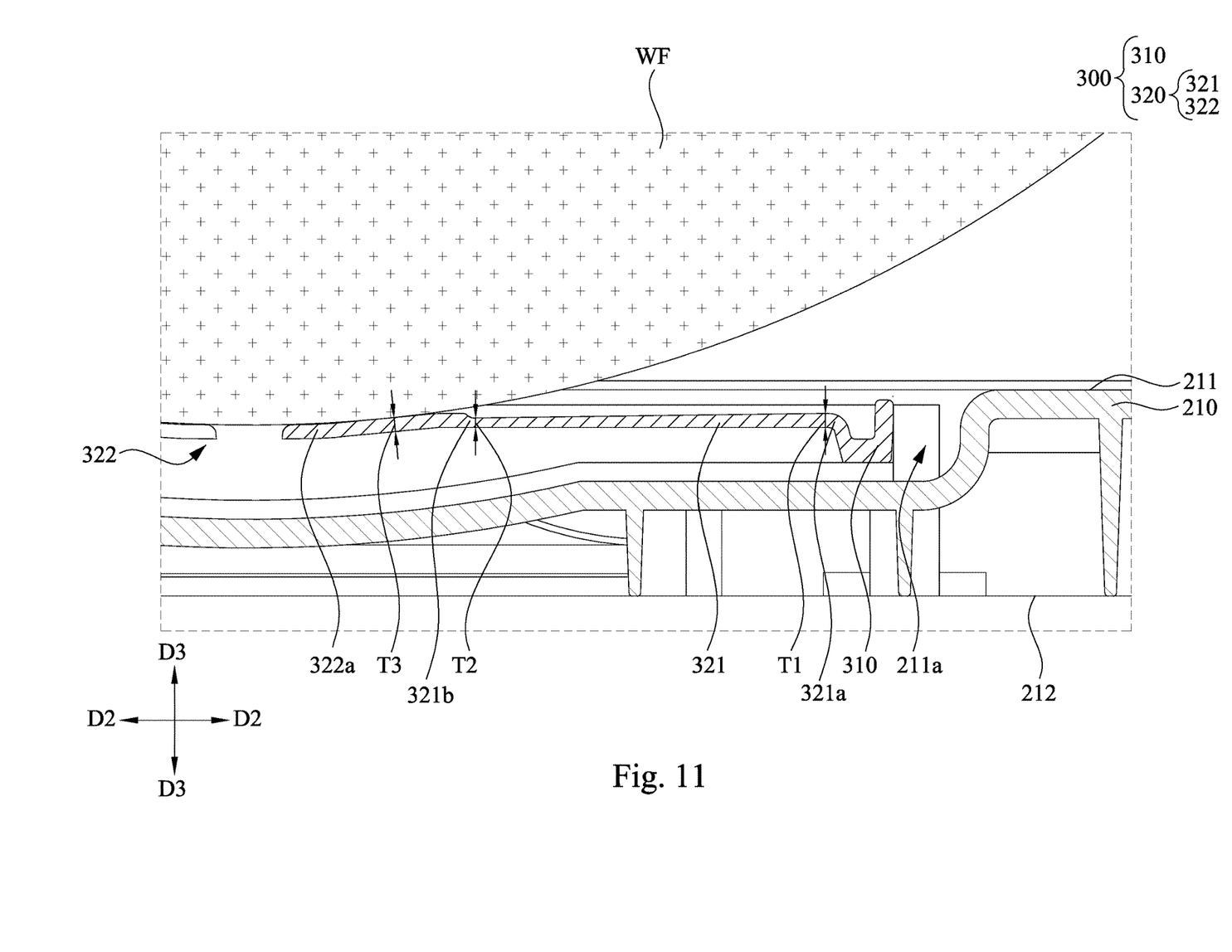
FIG. 11 is a partial enlarged view of FIG. 4.

Reference is made to FIG. 11. FIG. 11 is a partial enlarged view of FIG. 4. In the present embodiment, the elastic arm 321 has a first end 321a and a second end 321b. The first end 321a is connected to the retaining body 310. The second end 321b is connected to the clamping structure 322. A thickness T1 of the first end 321a of the elastic arm 321 is greater than a thickness T2 of the second end 321b. With this structural configuration, the thinner second end 321b can increase the overall elastic margin of the retaining member 320, and the thicker first end 321a can increase the structural strength when the substrate retaining assembly 300 is assembled to the door body 210.

The second end 321b of the elastic arm 321 is connected to the clamping body 322a of the clamping structure 322. The first end 321a of each of the elastic arms 321 extends to the second end 321b in a gradual manner from thick to thin. In other words, the thickness of the elastic arm 321 changes smoothly and gradually, and the thickness T1 at the first end 321a and the thickness T2 at the second end 321b are respectively the maximum thickness and the minimum thickness of the elastic arm 321, but the present disclosure is not limited thereto.

In this embodiment, the thickness T1 of the first end 321a of the elastic arm 321 is smaller than the thickness T3 of the clamping body 322a of the clamping structure 322. With this structural configuration, the structural strength of the position where the clamping body 322a of the clamping structure 322 contacts the wafer WF can be increased.

According to the foregoing recitations of the embodiments of the disclosure, it can be seen that in the substrate retaining assembly and the door device of the present disclosure, since the clamping structure of the retaining member is provided with the clamping groove and the relief portion, it can effectively reduce the direct contact area of the clamping structure when it abuts against a substrate such as a wafer. Moreover, in conjunction with the varying thickness design of the elastic arms of the retaining member, the effect of sufficient elastic margin and structural strength can be achieved. In this way, the overall substrate retaining assembly can effectively avoid problems such as cracks and breakage of the wafer due to excessive preload.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A substrate retaining assembly, comprising:
a retaining body; and
a plurality of retaining members disposed on the retaining body and arranged at intervals, each of the retaining members comprising:
two elastic arms; and
a clamping structure comprising:
a clamping body connected between the two elastic arms;
a clamping groove located on the clamping body and communicated with adjacent ends of the elastic arms; and
at least one relief portion communicated to the clamping groove.

2. The substrate retaining assembly of claim 1, wherein the clamping groove has two clamping surfaces opposite to each other, and the at least one relief portion is recessed relative to at least one of the two clamping surfaces.

3. The substrate retaining assembly of claim 1, wherein the clamping structure further comprises two wall portions, the two wall portions are disposed on the clamping body, and the clamping groove and the at least one relief portion are formed between the two wall portions.

4. The substrate retaining assembly of claim 3, wherein the clamping body and the at least one relief portion are laterally communicated, and a longitudinal section width of the clamping groove is smaller than a longitudinal section width of the at least one relief portion.

5. The substrate retaining assembly of claim 1, wherein the at least one relief portion is a recessed groove, a through hole running through the clamping body, or a combination thereof.

6. The substrate retaining assembly of claim 1, wherein a number of the at least one relief portion is plural, and the relief portions comprise:
at least one first relief portion; and
at least one second relief portion spaced apart from the at least one first relief portion,
wherein the at least one first relief portion and the at least one second relief portion are structures with different depths.

7. The substrate retaining assembly of claim 1, wherein each of the elastic arms has a first end and a second end, the first end is connected to the retaining body, the second end is connected to the clamping structure, and a thickness of the first end is greater than a thickness of the second end.

8. The substrate retaining assembly of claim 7, wherein the first end of each of the elastic arms extends to its respective second end in a gradual manner from thick to thin.

9. The substrate retaining assembly of claim 7, wherein the second end of each of the elastic arms is connected to the clamping body of the clamping structure, and the thickness of the second end is smaller than a thickness of the clamping body.

10. A door device, comprising:
a door body; and
a substrate retaining assembly disposed on a side of the door body and comprising:
a retaining body; and
a plurality of retaining members disposed on the retaining body and arranged at intervals, each of the retaining members comprising:
two elastic arms; and
a clamping structure comprising:
a clamping body connected between the two elastic arms;
a clamping groove located on the clamping body and communicated with adjacent ends of the elastic arms; and
at least one relief portion communicated to the clamping groove.

11. The door device of claim 10, wherein the clamping groove has two clamping surfaces opposite to each other, and the at least one relief portion is recessed relative to at least one of the two clamping surfaces.

12. The door device of claim 10, wherein the clamping structure further comprises two wall portions, the two wall portions are disposed on the clamping body, and the clamping groove and the at least one relief portion are formed between the two wall portions.

13. The door device of claim 12, wherein the clamping body and the at least one relief portion are laterally communicated, and a longitudinal section width of the clamping groove is smaller than a longitudinal section width of the at least one relief portion.

14. The door device of claim 10, wherein the at least one relief portion is a recessed groove, a through hole running through the clamping body, or a combination thereof.

15. The door device of claim 10, wherein the at least one relief portion is plural, and the relief portions comprise:
   at least one first relief portion; and
   at least one second relief portion spaced apart from the at least one first relief portion,
   wherein the at least one first relief portion and the at least one second relief portion are structures with different depths.

16. The door device of claim 10, wherein each of the elastic arms has a first end and a second end, the first end is connected to the retaining body, the second end is connected to the clamping structure, and a thickness of the first end is greater than a thickness of the second end.

17. The door device of claim 16, wherein the first end of each of the elastic arms extends to its respective second end in a gradual manner from thick to thin.

18. The door device of claim 16, wherein the second end of each of the elastic arms is connected to the clamping body of the clamping structure, and the thickness of the second end is smaller than a thickness of the clamping body.

* * * * *